(12) United States Patent
Li

(10) Patent No.: US 12,438,025 B2
(45) Date of Patent: Oct. 7, 2025

(54) SUBSTRATE PROCESSING SYSTEM

(71) Applicant: TOKYO ELECTRON LIMITED, Tokyo (JP)

(72) Inventor: Dongwei Li, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 307 days.

(21) Appl. No.: 18/120,195

(22) Filed: Mar. 10, 2023

(65) Prior Publication Data

US 2023/0307278 A1   Sep. 28, 2023

(30) Foreign Application Priority Data

Mar. 22, 2022   (JP) ................. 2022-044900

(51) Int. Cl.
*H01L 21/677* (2006.01)
*H01L 21/67* (2006.01)

(52) U.S. Cl.
CPC .. *H01L 21/67709* (2013.01); *H01L 21/67196* (2013.01); *H01L 21/67742* (2013.01); *H01L 21/67745* (2013.01); *H01L 21/67748* (2013.01)

(58) Field of Classification Search
None
See application file for complete search history.

(56) References Cited

U.S. PATENT DOCUMENTS

| | | | |
|---|---|---|---|
| 10,056,279 B2 * | 8/2018 | Janakiraman | ..... H01L 21/67709 |
| 10,737,403 B2 * | 8/2020 | Bauer | ...................... B26D 7/32 |
| 11,961,758 B2 * | 4/2024 | Shindo | .............. H01L 21/67709 |
| 12,009,240 B2 * | 6/2024 | Shindo | .............. H01L 21/67742 |

FOREIGN PATENT DOCUMENTS

| | | |
|---|---|---|
| JP | 2018-504784 A | 2/2018 |
| JP | 2021-086986 A | 6/2021 |
| WO | WO 2016/118335 A1 | 7/2016 |

* cited by examiner

*Primary Examiner* — Michael S Lowe
(74) *Attorney, Agent, or Firm* — Fenwick & West LLP

(57) ABSTRACT

A substrate processing system comprises a module having a mounting unit on which a substrate is mounted, a transfer chamber connected to the module, and a substrate transfer device disposed in the transfer chamber and configured to transfer the substrate to the module. The substrate transfer device includes a transfer unit having a substrate holder and a base that has therein a magnet and moves the substrate holder along a bottom portion of the transfer chamber, and a planar motor having a plurality of tiles arranged along the bottom portion of the transfer chamber, a plurality of electromagnetic coils disposed in the plurality of tiles, and a linear driving device configured to supply power to the electromagnetic coils and magnetically levitate and linearly drive the base. A tile corresponding to the module among the plurality of tiles is connected to the module without being connected to the transfer chamber.

9 Claims, 5 Drawing Sheets

SUBSTRATE PROCESSING SYSTEM

CROSS-REFERENCE TO RELATED APPLICATIONS

This application claims priority to Japanese Patent Application No. 2022-044900, filed on Mar. 22, 2022, the entire contents of which are incorporated herein by reference.

TECHNICAL FIELD

The present disclosure relates to a substrate processing system.

BACKGROUND

For example, in a semiconductor manufacturing process, a substrate processing system including a plurality of processing chambers, a transfer chamber connected to the processing chambers, and a substrate transfer device disposed in the transfer chamber is used for processing a semiconductor wafer that is a substrate.

In such a substrate processing system, a substrate transfer device for transferring a substrate including a planar motor using magnetic levitation and a substrate transfer unit (substrate carrier) for transferring a substrate disposed above an upper surface of the planar motor is suggested as a substrate transfer device. In this technique, a planar motor is used as a bottom surface of a transfer chamber, and the substrate is loaded into and unloaded from a processing chamber in a state where the substrate is mounted on a mounting table of the substrate transfer unit.

SUMMARY

The present disclosure provides a substrate processing system capable of transferring a substrate to a mounting unit of a module with high positional accuracy by a substrate transfer device using a planar motor.

One aspect of the present disclosure provides a substrate processing system comprising: a module having a mounting unit on which a substrate is mounted; a transfer chamber connected to the module; and a substrate transfer device disposed in the transfer chamber and configured to transfer the substrate to the module, wherein the substrate transfer device includes: a transfer unit having a substrate holder that is configured to hold the substrate and is accessible to the mounting unit of the module, and a base that has therein a magnet and moves the substrate holder along a bottom portion of the transfer chamber; and a planar motor having a plurality of tiles arranged along the bottom portion of the transfer chamber, a plurality of electromagnetic coils disposed in each of the plurality of tiles, and a linear driving device configured to supply power to the electromagnetic coils and magnetically levitate and linearly drive the base, wherein a tile corresponding to the module among the plurality of tiles is connected to the module without being connected to the transfer chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings.

Figure 1:
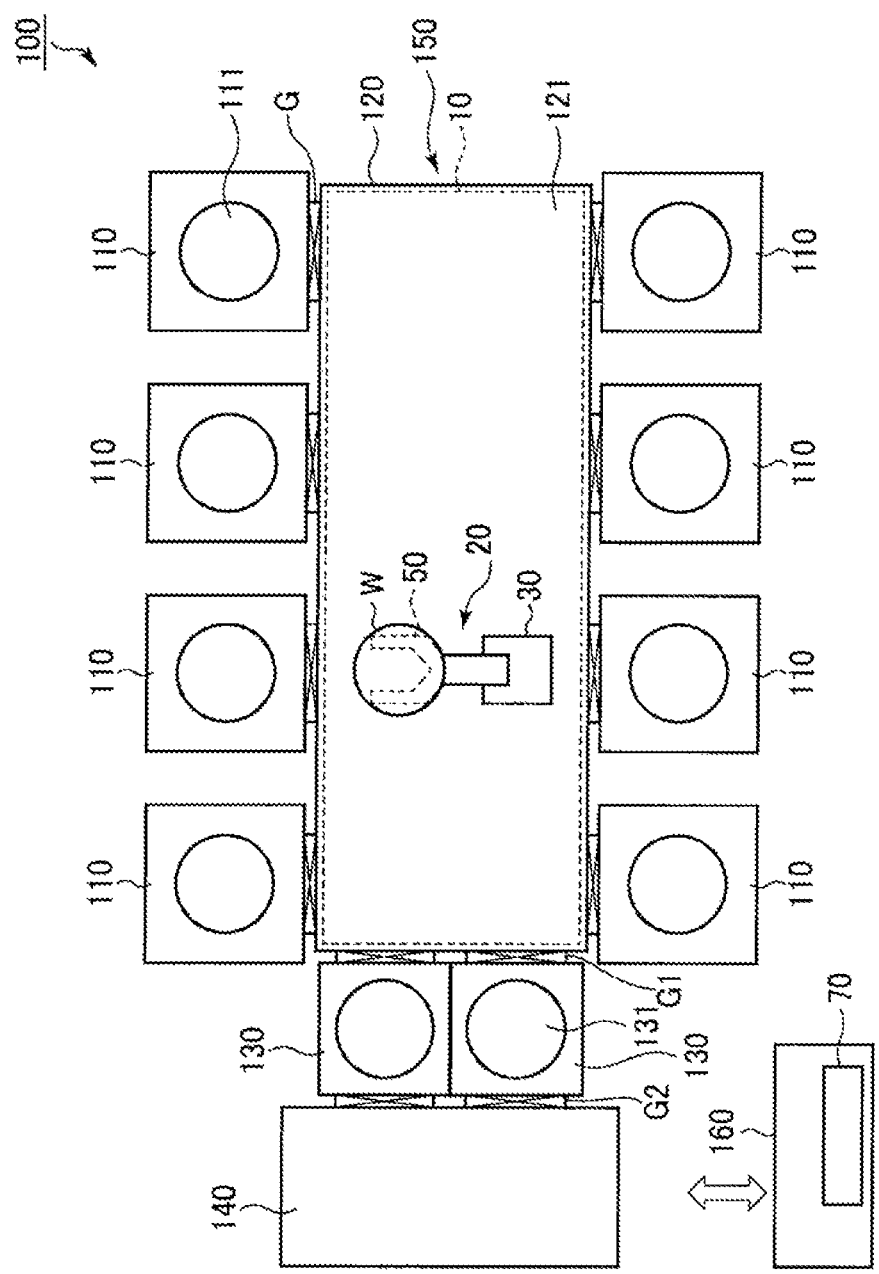
FIG. 1 is a schematic plan view showing a substrate processing system according to one embodiment.

FIG. 1 is a schematic plan view showing a substrate processing system according to one embodiment.

A substrate processing system 100 of the present embodiment continuously processes a plurality of substrates. The processing of the substrate is not particularly limited, and may include various types of processing such as film formation, etching, ashing, and cleaning. The substrate is not particularly limited, but may be a semiconductor wafer, for example.

As shown in FIG. 1, the substrate processing system 100 is a multi-chamber type system and includes a plurality of processing chambers 110, a vacuum transfer chamber 120, two load-lock chambers 130, an atmospheric transfer chamber 140, a substrate transfer device 150, and a controller 160.

The vacuum transfer chamber 120 has a rectangular planar shape, and is evacuated to a vacuum atmosphere. The plurality of processing chambers 110 are connected to walls on the long side of the vacuum transfer chamber 120 facing each other via gate valves G. The two load-lock chambers 130 are connected to one wall on the short side of the vacuum transfer chamber 120 via gate valves G1. The atmospheric transfer chamber 140 is connected to the two load-lock chambers 130 on the sides of the two load-lock chambers 130 opposite to the sides connected to the vacuum transfer chamber 120 via gate valves G2. The processing chambers 110 and the load-lock chambers 130 function as modules where the loading/unloading of the substrate W is performed, each module having a mounting unit on which the substrate W is mounted.

The substrate transfer device 150 in the vacuum transfer chamber 120 loads/unloads the substrate W into/from the processing chambers 110 and the load-lock chambers 130, and has a planar motor (linear unit) 10 and a transfer unit 20. The substrate transfer device 150 will be described in detail later.

The processing chambers 110 and the vacuum transfer chamber 120 communicate with each other by opening the gate valves G so that the substrate W can be transferred by the substrate transfer device 150. The processing chambers 110 and the vacuum transfer chamber 120 are shut off by closing the gate valves G. Further, the load-lock chambers 130 and the vacuum transfer chamber 120 communicate with each other by opening the gate valves G1 so that the substrate W can be transferred by the substrate transfer device 150. The load-lock chambers 130 and the vacuum transfer chamber 120 are shut off by closing the gate valves G1.

Each of the processing chambers 110 has a mounting table 111 having a mounting location on which the substrate W is mounted. Desired processing (film formation, etching, ashing, cleaning process, or the like) is performed on the substrate W mounted on the mounting table 111 in a state where the processing chamber 110 is evacuated to a vacuum atmosphere.

Each of the load-lock chambers 130 has a mounting table 131 on which the substrate W is mounted, and controls a pressure between an atmospheric pressure and a vacuum when the substrate W is transferred between the atmospheric transfer chamber 140 and the vacuum transfer chamber 120.

The atmospheric transfer chamber 140 is maintained at an atmospheric atmosphere. For example, downflow of clean air is formed in the atmospheric transfer chamber 140. A load port (not shown) is disposed on a wall surface of the atmospheric transfer chamber 140. A carrier (not shown) containing substrates W or an empty carrier is connected to the load port. The carrier may be a front opening unified pod (FOUP) or the like, for example.

An atmospheric transfer device (not shown) for transferring a substrate W is disposed in the atmospheric transfer chamber 140. The atmospheric transfer device takes out the substrate W accommodated in the load port (not shown) and places it on the placing table 131 of the load-lock chamber 130. Further, the atmospheric transfer device takes out the substrate W mounted on the mounting table 131 of the load-lock chamber 130 and accommodates it in the load port. The load-lock chambers 130 and the atmosphere transfer chamber 140 communicate with each other by opening the gate valves G2 so that the substrate W can be transferred by the atmosphere transfer device. The load-lock chambers 130 and the atmosphere transfer chamber 140 are shut off by closing the gate valves.

The controller 160 is configured as a computer, and includes a main controller having a CPU, an input device, an output device, a display device, and a storage device (storage medium). The main controller controls operations of individual components of the substrate processing system 100. For example, the main controller controls the processing of the substrate W in each processing chamber 110, the opening and closing of the gate valves G, G1, G2, and the like. The main controller controls the individual components based on a processing recipe that is a control program stored in the storage medium (a hard disk, an optical disk, a semiconductor memory, or the like) in the storage device.

Further, in the present embodiment, the controller 160 has a transfer controller 70 for controlling the substrate transfer device 150.

Figure 2:
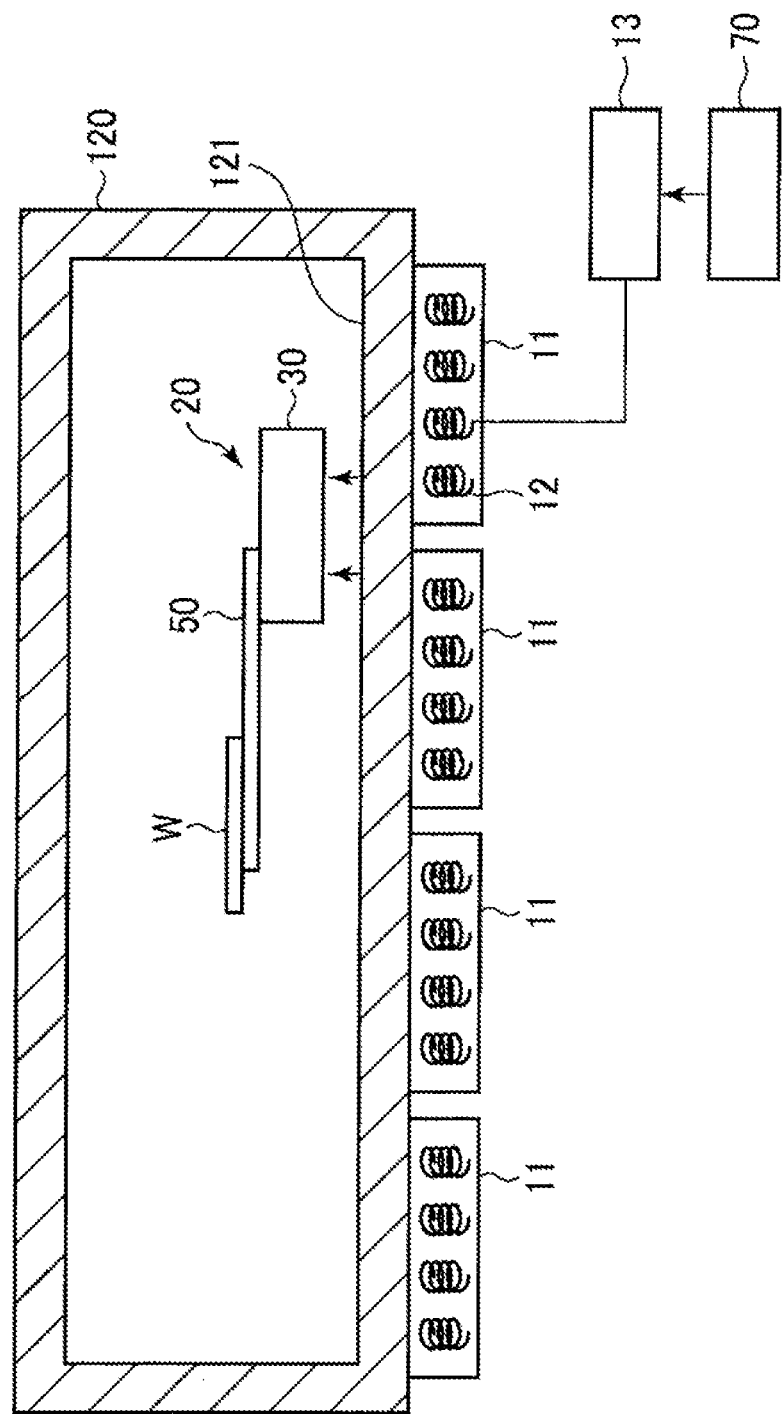
FIG. 2 is a cross-sectional view illustrating a planar motor and a transfer unit of a substrate transfer device.
Figure 3:
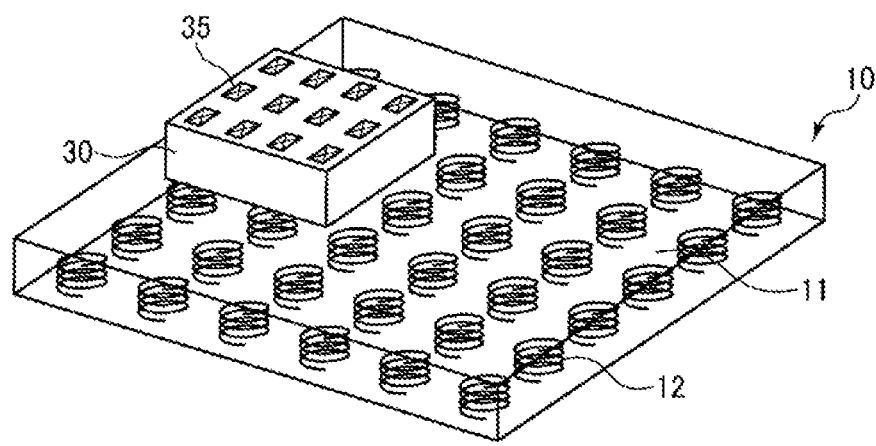
FIG. 3 is a perspective view illustrating the driving principle of the planar motor.
Figure 4:
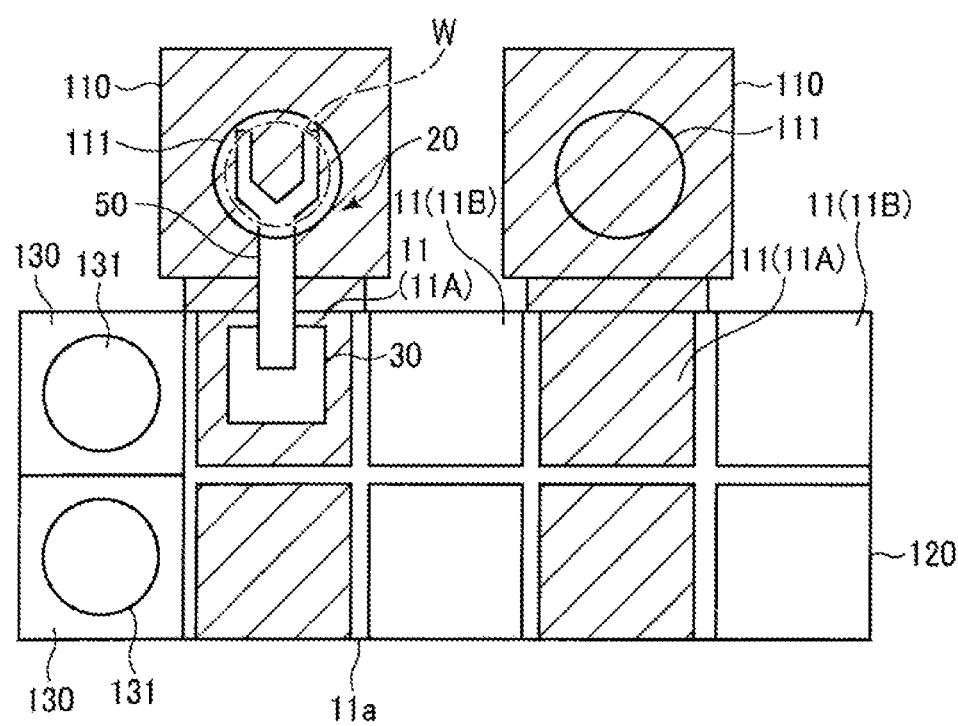
FIG. 4 is a schematic cross-sectional view showing the arrangement of tiles in the substrate processing system according to one embodiment.
Figure 5:
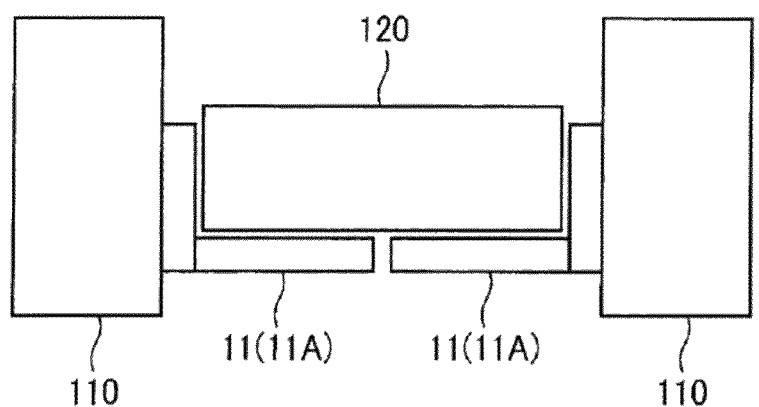
FIG. 5 is a schematic plan view showing the arrangement of tiles in the substrate processing system according to one embodiment.

Next, the substrate transfer device 150 of the present embodiment will be described in detail with reference to FIGS. 2 to 5 in addition to FIG. 1 described above. FIG. 2 is a cross-sectional view illustrating the planar motor and the transfer unit of the substrate transfer device. FIG. 3 is a perspective view illustrating the driving principle of the planar motor. FIG. 4 is a schematic cross-sectional view showing the arrangement of tiles in the substrate processing system in the present embodiment. FIG. 5 is a schematic plan view showing the arrangement of tiles in the substrate processing system in the present embodiment.

The substrate transfer device 150 has the planar motor (linear unit) 10 and the transfer unit 20 as described above.

The planar motor (linear unit) 10 linearly drives the transfer unit 20 (mover). The planar motor (linear unit) 10 has a plurality of tiles 11 (stators) arranged along the bottom portion of the vacuum transfer chamber 120. Specifically, the tiles 11 are arranged on an entire bottom wall 121 of the vacuum transfer chamber 120. A plurality of electromagnetic coils 12 are arranged in each tile 11, and are connected to a linear driving device 13 that generates a magnetic field by individually supplying power to the electromagnetic coils and linearly drives the transfer unit 20. The linear driving device 13 is controlled by the transfer controller 70.

The transfer unit 20 includes an end effector 50 that is a substrate holder for holding the substrate W, and a base 30. The end effector 50 is attached to the base 30. The end effector 50 can access the mounting tables 111 of the processing chambers 110 and the mounting tables 131 of the load-lock chambers 130. Although an example in which one transfer unit 20 is provided is illustrated, two or more transfer units 20 may be provided.

As shown in FIG. 3, the base 30 has therein a plurality of permanent magnets 35, and is driven by a magnetic field generated by supplying a current to the electromagnetic coils 12 in the tiles 11 of the planar motor 10. As the base 30 is driven, the end effector 50 holding the substrate W is moved.

By setting the direction of the currents supplied to the electromagnetic coils 12 of the planar motor (linear unit) 10 to a direction in which the magnetic field generated by the current supply repels the permanent magnets 35, the base 30 is magnetically levitated from the surfaces of the tiles 11. By stopping the current supply to the electromagnetic coils 12, the base 30 stops levitation and is mounted on the floor of the bottom wall 121 of the vacuum transfer chamber 120.

By individually controlling the currents supplied from the linear driving device 13 to the electromagnetic coils 12 using the transfer controller 70, it is possible to control the position of the magnetically levitated base 30 while moving (linearly moving and rotating) the base 30 along the floor of the vacuum transfer chamber 120 on which the tiles 11 are arranged. The levitation amount can be controlled by controlling the current. The position of the base 30 is controlled by the transfer controller 70 with respect to the positions of the tiles 11.

In the present embodiment, as shown in FIGS. 4 and 5, among the tiles 11 of the planar motor 10, the tiles 11 (hereinafter, referred to as "tiles 11A") disposed at positions corresponding to the processing chambers 110, each having the mounting table 111 that is the mounting unit for placing the substrate W thereon, are connected to the processing chambers 110 without being connected to the vacuum transfer chamber 120. The processing chamber 110 is a module that particularly requires a high transfer accuracy because the substrate W is mounted on the mounting table 111 that is the mounting unit.

On the other hand, among the tiles 11 of the planar motor 10, the tiles (hereinafter, referred to as "tiles 11B") that do not correspond to the processing chambers 110 are connected to the vacuum transfer chamber 120.

The tiles 11A are disposed to correspond to the processing chambers 110, respectively, and the tiles 11B are disposed between the tiles 11A to be adjacent to the tiles 11A.

Since the tiles 11A corresponding to the processing chambers 110 are connected to the processing chambers 110, even if the vacuum transfer chamber 120 expands due to external heat, for example, the positions of the tiles 11A follow the corresponding processing chambers 110 without following the thermal expansion of the vacuum transfer chamber 120. On the other hand, the tiles 11B that do not correspond to the processing chambers 110 are connected to the vacuum transfer chamber 120, and thus thermally expand while following the thermal expansion of the vacuum transfer chamber 120.

A gap 11a is formed between adjacent tiles 11, and has a function of absorbing thermal expansion of the tiles 11. For example, the tiles 11A connected to the processing chambers 110 and the tiles 11B that are not connected to the processing chambers 110 have different thermal expansion amounts, but the gap 11a therebetween can absorb the thermal expansion difference. The width of the gap 11a is appropriately set depending on the thermal expansion amounts of the tiles, and is about 1 mm or less.

Next, an example of the operation of the substrate processing system 100 will be described. Here, the operation of processing the substrate W accommodated in the carrier attached to the load port in the processing chamber 110 and accommodating the substrate W in an empty carrier attached to the load port will be described as an example of the operation of the substrate processing system 100. The following operations are executed based on the processing recipe of the controller 160.

First, the substrate W is taken out from the carrier connected to the load port by an atmospheric transfer device (not shown) in the atmospheric transfer chamber 140, and is loaded into the load-lock chamber 130 maintained in an atmospheric atmosphere by opening the gate valve G2. Then, the gate valve G2 is closed, and the load-lock chamber 130 into which the substrate W is loaded is set to a vacuum state corresponding to the vacuum transfer chamber 120. Next, the corresponding gate valve G1 is opened, and the substrate W in the load-lock chamber 130 is taken out by the end effector 50 of the transfer unit 20. Then, the gate valve G1 is closed. Next, the gate valve G corresponding to one of the processing chambers 110 is opened and, then, the substrate W is loaded into the corresponding processing chamber 110 by the end effector 50 and mounted on the mounting table 111. The end effector 50 retracts from the processing chamber 110, and the gate valve G is closed so that the processing such as film formation or the like is performed in the processing chamber 110.

After the processing in the processing chamber 110 is completed, the corresponding gate valve G is opened, and the end effector 50 of the transfer unit 20 takes out the substrate W from the processing chamber 110. Then, the gate valve G is closed, and the gate valve G1 is opened so that the substrate W held by the end effector 50 is transferred to the load-lock chamber 130. Then, the gate valve G1 is closed, and the load-lock chamber 130 into which the substrate W is loaded is set to an atmospheric atmosphere. Next, the gate valve G2 is opened, and the substrate W is taken out from the load-lock chamber 130 by an atmospheric transfer device (not shown) and accommodated in a carrier of a load port (both not shown). The above processes are performed on a plurality of substrates W at the same time using the plurality of processing chambers 110. In this case, more efficient processing can be performed by providing a plurality of transfer units 20 and transferring a plurality of substrates W simultaneously using the transfer units 20.

Although the parallel transfer in which the substrate transfer device 150 transfers the substrate W to any one of the processing chambers 110 while another substrate W is being transferred to another processing chamber 110 has been described, the present disclosure is not limited thereto. For example, the serial transfer in which one substrate W is sequentially transferred to the plurality of processing chambers 110 may be performed.

During the above processing, the substrate W is transferred by the substrate transfer device 150 having the planar motor (linear unit) 10 and the transfer unit 20. In the substrate transfer device 150, by individually controls the currents supplied from the linear driving device 13 to the electromagnetic coils 12 using the transfer controller 70, the base 30 is magnetically levitated and the position of the base 30 is controlled while moving (linearly moving and rotating) the base 30. The transfer position control at this time is performed with respect to the positions of the tiles 11.

Figure 6:
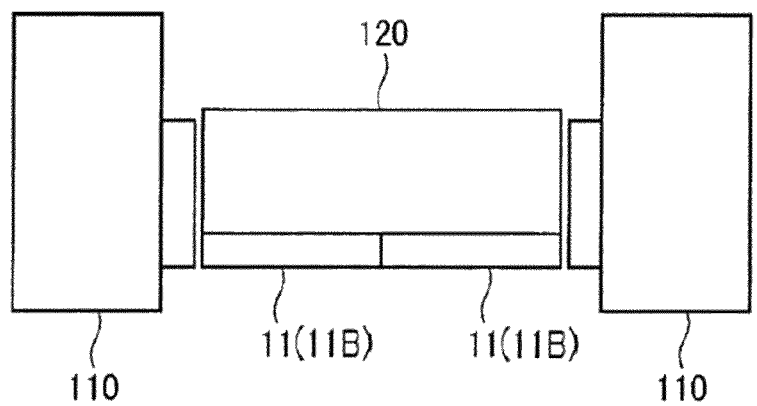
FIG. 6 is a schematic cross-sectional view showing the arrangement of tiles in a conventional substrate processing system.

Conventionally, the tiles 11 as stators are generally attached to the vacuum transfer chamber 120 as shown in FIG. 6.

Figure 7:
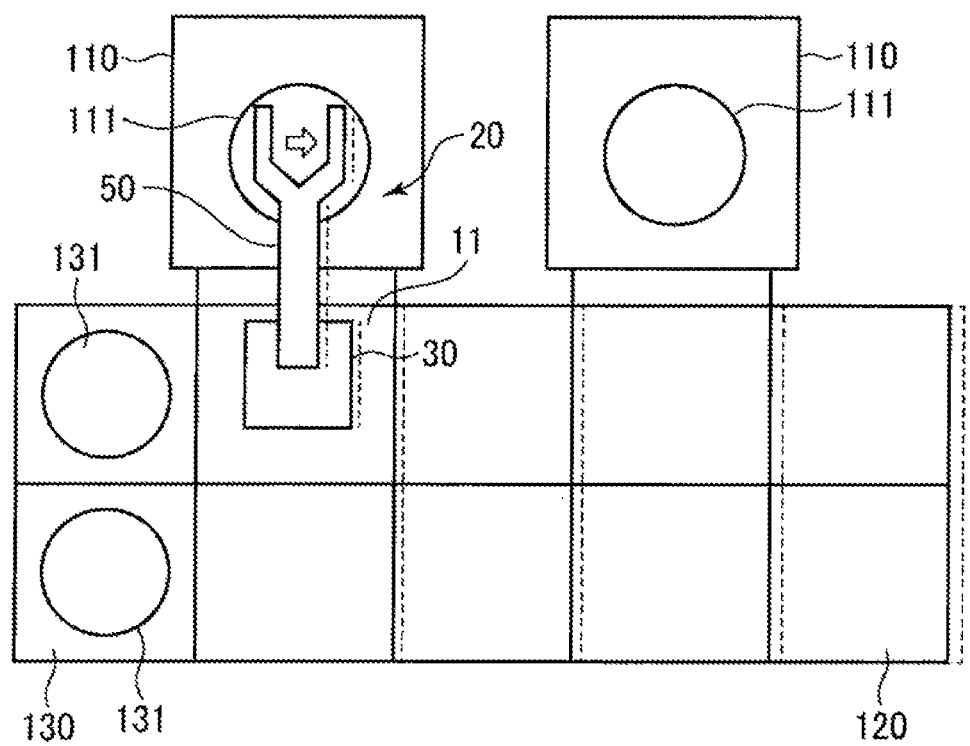
FIG. 7 is a schematic plan view schematically illustrating a thermal expansion state in the conventional substrate processing system.

The vacuum transfer chamber 120 is a large container to which a plurality of modules such as the processing chambers 110 and the load-lock chambers 130 are connected, and is relatively easily deformed by switching between the atmospheric pressure and the vacuum or thermally expanded by an external heat source. Therefore, the positional misalignment (displacement) of the tiles 11 due to the deformation or thermal expansion of the vacuum transfer chamber 120 is relatively large. For example, when heat is applied by an external heat source, the vacuum transfer chamber 120 is expanded toward the opposite side of the load-lock chambers 130 mainly where the modules are not disposed and the hardness is low, and the tiles 11 are also displaced toward the same side, as shown in FIG. 7. Hence, the access position of the transfer unit 20 with respect to the processing chamber 110 is also displaced.

On the other hand, among the modules connected to the vacuum transfer chamber 120, the processing chambers 110 require a high transfer accuracy at the time of transferring the substrate W to the mounting table 111 to perform high-precision processing on the substrate W. Further, the processing chambers 110 are modules whose positions are less likely to change due to a seismic resistance or the like.

Therefore, conventionally, due to the displacement of the tiles 11 caused by the thermal expansion or deformation of the vacuum transfer chamber 120, the positional misalignment may occur when the substrate W is transferred to the processing chamber 110 and mounted on the mounting table 111.

On the other hand, in the present embodiment, among the plurality of tiles 11 of the planar motor 10, the tiles 11A disposed at positions corresponding to the processing chambers 110 that requires a high substrate transfer accuracy are connected to the processing chambers 110 without being connected to the vacuum transfer chamber 120. Therefore, the tiles 11A are displaced while following the processing chambers 110 connected thereto without being displaced while following the thermal expansion or deformation of the vacuum transfer chamber 120.

Even if the vacuum transfer chamber 120 is thermally expanded or deformed, the tiles 11A serving as the reference for the position control of the transfer unit 20 at the time of transferring the substrate W to the mounting table 111 of the processing chamber 110 are displaced while following the processing chambers 110 connected thereto. Therefore, the positional misalignment hardly occurs when the substrate W is transferred to the processing chamber 110.

The tiles 11B that do not correspond to the processing chambers 110 are displaced while following the thermal expansion or deformation of the vacuum transfer chamber 120, so that the tiles 11A and the tiles 11B have different displacement amounts. Since, however, the gap 11a is formed therebetween, the displacement amount difference can be absorbed.

In order to improve the transfer accuracy of the transfer unit 20 in the vacuum transfer chamber 120 regardless of the tiles 11A and 11B, it is possible to perform control of detecting the deformation of the vacuum transfer chamber 120 by an external sensor and correcting the absolute position of the transfer unit 20 (the base 30). Specifically, it is possible to perform control of calculating the positional misalignment of the tiles 11 from the deformation amount detected by the external sensor, feedbacking the positional misalignment to the transfer controller 70, adjusting the current distribution of the electromagnetic coils to cancel the positional misalignment of the tiles 11, and correcting the absolute position of the transfer unit 20.

While the embodiments of the present disclosure have been described, it should be noted that the embodiments of the present disclosure are illustrative in all respects and are not restrictive. The above-described embodiments may be omitted, replaced, or changed in various forms without departing from the scope of the appended claims and the gist thereof.

For example, in the above-described embodiments, the transfer unit of the substrate processing system has a configuration in which the end effector is directly attached to the base. However, a link mechanism may be disposed between the base and the end effector. Further, two or more bases may be used.

Further, in the above-described embodiments, the processing chamber that particularly requires a transfer accuracy has been described as a module in which the loading/unloading of the substrate is performed and a mounting unit for placing a substrate is disposed. However, the present disclosure is not limited thereto. Such a module may be the above-described load-lock chamber, or may be another module.

Although a semiconductor wafer has been described as an example of a substrate, the substrate is not limited thereto, and may be another substrate such as a flat panel display (FPD) substrate, a quartz substrate, a ceramic substrate, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system comprising:
a module having a mounting unit on which a substrate is mounted;
a transfer chamber connected to the module; and
a substrate transfer device configured to transfer the substrate to the module,
wherein the substrate transfer device includes:
a transfer unit having a substrate holder that is configured to hold the substrate and is accessible to the mounting unit of the module, and a base that has therein a magnet and moves the substrate holder along a bottom portion of the transfer chamber; and
a planar motor having a plurality of tiles arranged along the bottom portion of the transfer chamber, a plurality of electromagnetic coils disposed in each of the plurality of tiles and supplied with power, and wherein the planar motor is configured to magnetically levitate and linearly drive the base,
wherein a tile disposed at a position corresponding to the module among the plurality of tiles is connected to the module without being connected to the transfer chamber.

2. The substrate processing system of claim 1, wherein a gap is formed between adjacent tiles among the plurality of tiles.

3. The substrate processing system of claim 2, wherein the gap has a width of 1 mm or less.

4. The substrate processing system of claim 1, wherein a tile that is not disposed at the position corresponding to the module among the plurality of tiles is connected to the transfer chamber.

5. The substrate processing system of claim 4, wherein among the plurality of tiles, the tile disposed at the position corresponding to the module and the tile that is not disposed at the position corresponding to the module are adjacent to each other with a gap therebetween.

6. The substrate processing system of claim 5, wherein the gap has a width of 1 mm or less.

7. The substrate processing system of claim 1, wherein the module is a processing chamber for processing the substrate, and has therein a mounting table serving as the mounting unit.

8. The substrate processing system of claim 7, wherein the processing chamber is provided in plural.

9. The substrate processing system of claim 1, wherein the plurality of tiles are arranged below a bottom wall of the transfer chamber.

* * * * *